(12) United States Patent
Voo

(10) Patent No.: US 7,417,484 B1
(45) Date of Patent: *Aug. 26, 2008

(54) LEVEL SHIFTER WITH BOOST AND ATTENUATION PROGRAMMING

(75) Inventor: Thart Fah Voo, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/710,362

(22) Filed: Feb. 23, 2007

Related U.S. Application Data

(63) Continuation of application No. 10/929,214, filed on Aug. 30, 2004, now Pat. No. 7,183,832.

(51) Int. Cl.
 *H03L 5/00* (2006.01)
(52) U.S. Cl. .............................. 327/333; 326/80; 326/81
(58) Field of Classification Search ................. 327/333; 326/80, 81
 See application file for complete search history.

(56) References Cited

U.S. PATENT DOCUMENTS

| | | | | |
|---|---|---|---|---|
| 4,868,427 A | 9/1989 | Fitzpatrick et al. | ............ | 326/74 |
| 4,939,393 A | 7/1990 | Petty | ............................ | 326/78 |
| 5,682,108 A | 10/1997 | Min | ............................ | 326/64 |
| 6,191,635 B1 | 2/2001 | Thompson et al. | .......... | 327/333 |
| 6,259,321 B1 | 7/2001 | Song et al. | .................. | 330/254 |
| 6,300,802 B1 | 10/2001 | Smetana | ..................... | 326/126 |
| 6,331,803 B1 | 12/2001 | Zheng et al. | ................ | 330/254 |
| 6,337,586 B2 | 1/2002 | Aizawa | ...................... | 327/108 |
| 6,483,345 B1 | 11/2002 | Whittaker et al. | ............. | 326/62 |
| 6,952,240 B2 | 10/2005 | Gower et al. | ................ | 348/678 |
| 6,958,652 B2 | 10/2005 | Kim et al. | .................... | 330/254 |
| 7,183,832 B1 * | 2/2007 | Voo | ............................. | 327/333 |

* cited by examiner

Primary Examiner—Kenneth B. Wells

(57) ABSTRACT

A level shifter circuit comprises a bias module that receives a first signal and that selectively outputs a selected one of a second signal and a third signal based on an operating frequency of said level shifter circuit. A programmable gain module receives a gain control signal, and generates a fourth signal based on said gain control signal and said selected one of said second signal and said third signal. A bias generation module communicates with said programmable gain module, receives said gain control signal, and generates a bias for said level shifter circuit based on said gain control signal.

30 Claims, 8 Drawing Sheets

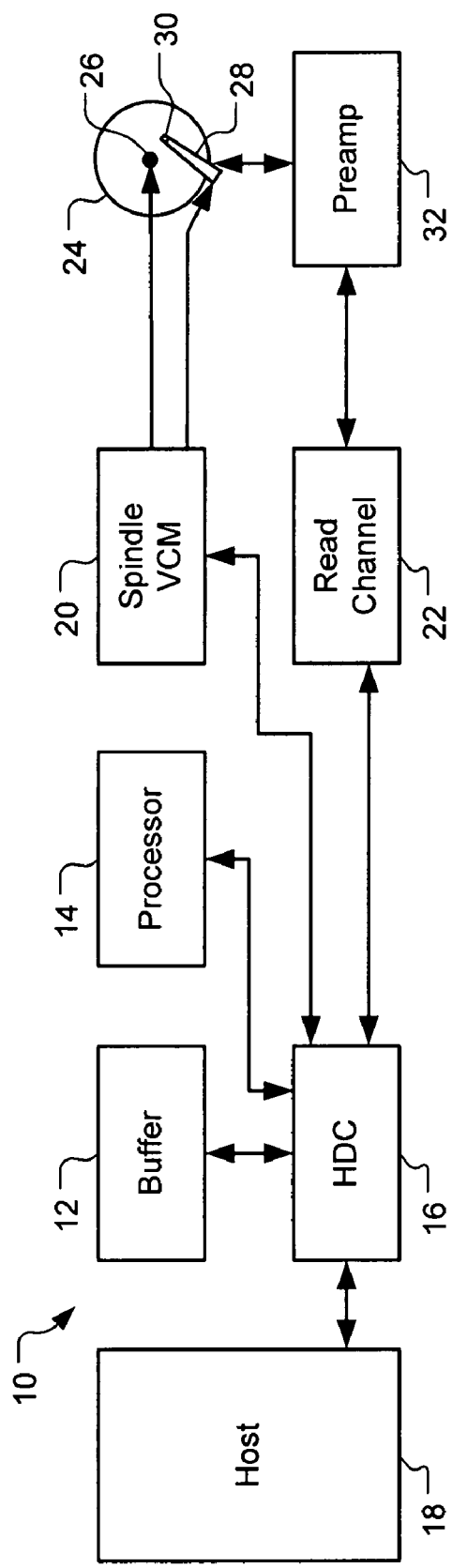
FIG. 1
_Prior Art_
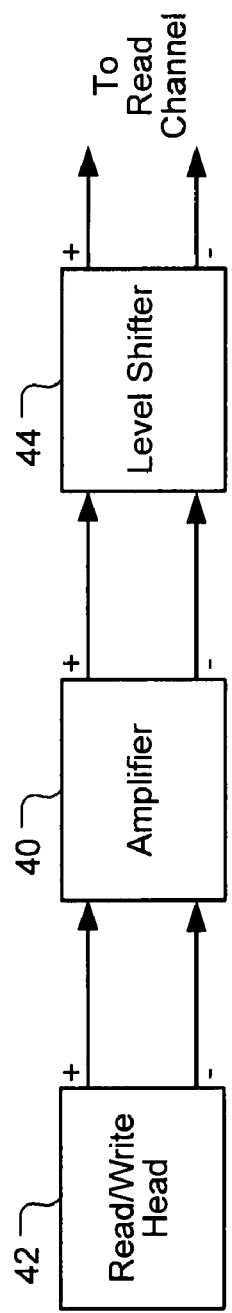
FIG. 2
_Prior Art_

LEVEL SHIFTER WITH BOOST AND ATTENUATION PROGRAMMING

CROSS-REFERENCE TO RELATED APPLICATIONS

This application is a continuation of U.S. patent application Ser. No. 10/929,214 filed on Aug. 30, 2004, now U.S. Pat. No. 7,183,832, issued Feb. 27, 2007. The disclosure of the above application is incorporated herein by reference.

FIELD OF THE INVENTION

The present invention relates to level shifter circuits, and more particularly to analog level shifter circuits with programmable gains.

BACKGROUND OF THE INVENTION

Referring to FIG. 1, an exemplary magnetic storage system 10 such as a hard disk drive is shown. A buffer 12 stores data that is associated with the control of the hard disk drive. The buffer 12 may employ SDRAM or other types of low latency memory. A processor 14 performs processing that is related to the operation of the hard disk drive. A hard disk controller (HDC) 16 communicates with the buffer 12, the processor 14, a host 18, a spindle/voice coil motor (VCM) driver 20, and/or a read/write channel circuit 22.

During a write operation, the read/write channel circuit (or read channel circuit) 22 encodes the data to be written onto the storage medium. The read/write channel circuit 22 processes the signal for reliability and may include, for example error correction coding (ECC), run length limited coding (RLL), and the like. During read operations, the read/write channel circuit 22 converts an analog output from the medium to a digital signal. The converted signal is then detected and decoded by known techniques to recover the data written on the hard disk drive.

One or more hard drive platters 24 include a magnetic coating that stores magnetic fields. The platters 24 are rotated by a spindle motor that is schematically shown at 26. Generally the spindle motor 26 rotates the hard drive platter 24 at a fixed speed during the read/write operations. One or more read/write arms 28 move relative to the platters 24 to read and/or write data to/from the hard drive platters 24. The spindleNCM driver 20 controls the spindle motor 26, which rotates the platter 24. The spindleNCM driver 20 also generates control signals that position the read/write arm 28, for example using a voice coil actuator, a stepper motor or any other suitable actuator.

A read/write device 30 is located near a distal end of the read/write arm 28. The read/write device 30 includes a write element such as an inductor that generates a magnetic field. The read/write device 30 also includes a read element (such as a magneto-resistive (MR) sensor) that senses the magnetic fields on the platter 24. A preamplifier (preamp) circuit 32 amplifies analog read/write signals. When reading data, the preamp circuit 32 amplifies low level signals from the read element and outputs the amplified signal to the read/write channel circuit 22. While writing data, a write current that flows through the write element of the read/write channel circuit 22 is switched to produce a magnetic field having a positive or negative polarity. The positive or negative polarity is stored by the hard drive platter 24 and is used to represent data.

Referring now to FIG. 2, an input of an amplifier 40 receives analog read signals from a read/write head 42. The amplifier 40 amplifies the read signals and outputs the amplified read signals to a level shifter 44. The level shifter 44 outputs a shifted voltage signal. The level shifter 44 shifts the voltage range at its input by a constant voltage. For example, the level shifter 44 may shift the range of voltages by a value that is equal to a threshold voltage of a transistor. However, other voltage shift magnitudes are possible. The level shifter 44 outputs the shifted voltage signal to a read channel.

Referring now to FIG. 3, the level shifter 44 includes a source follower module 52, a load module 54, and a bias generation module 56. An MR sensor 58 in the read/write head 42 outputs read signals to an operational amplifier (opamp) 60 in the amplifier 40. The opamp 60 outputs amplified read signals to the source follower module 52 in the level shifter 44. The source follower module 52 communicates with the load module 54 and outputs a first voltage value to the load module 54 based on the amplified signals. The bias generation module 56 also communicates with the load module 54 and generates a bias current for the level shifter 44. The load module 54 receives the bias current and outputs an output voltage value to the read channel. For example, the output voltage value may be equal to a value of the amplified read signals combined with a voltage drop across a resistor in the load module and a threshold voltage of a transistor in the source follower module 52.

The gain of the level shifter 44 may be adjusted by changing the bias current that is output by the bias generation module 56 and/or the value of a resistor in the load module 54. However, the operating parameters of the level shifter 44 are typically set during manufacturing. Therefore, a new level shifter 44 is typically required when an operating parameter of a circuit changes. A new level shifter 44 may need to be manufactured according to a desired specification and/or to suit a particular application. This may be both costly and time consuming when a desired circuit configuration changes.

SUMMARY OF THE INVENTION

A level shifter circuit according to the present invention includes a bias module that receives a first voltage value, that generates a second voltage value when an operational frequency of the level shifter circuit is less than a threshold, and that generates a third voltage value when the operational frequency is greater than or equal to the threshold. A programmable gain module communicates with the bias module and generates a fourth voltage value based on the second voltage value when the operational frequency is less than the threshold and based on the third voltage value when the operational frequency is greater than or equal to the threshold.

In other features, the bias module includes a load module that receives the first voltage value and that generates the second voltage value and a bypass module that receives the first voltage value and that generates the third voltage value. The first voltage value and the third voltage value are equal. A gain value of the programmable gain module determines a voltage gain of the level shifter circuit. A switching gain module communicates with the bias module and generates the first voltage value based on an input voltage value. The input voltage value is referenced from differential voltage inputs. A bias generation module communicates with the programmable gain module and generates a bias current for the level shifter circuit. A value of the bias current determines a voltage gain of the level shifter circuit. An output driver module receives the fourth voltage value and generates an output voltage value based on the fourth voltage value. The output voltage value is referenced from differential voltage outputs.

In still other features of the invention, the load module includes first and second resistances. The programmable gain module includes a programmable resistance. The bypass module includes first and second capacitances. First ends of the first and second capacitances communicate with first ends of the first and second resistances, respectively. Second ends of the first and second capacitances communicate with second ends of the first and second resistances, respectively. First and second ends of the programmable resistance communicate with the first ends of the first and second resistances, respectively, and the first ends of the first and second capacitances. The first and second resistances are one of p-channel metal-oxide semiconductor (PMOS) diode-connected resistors or n-channel MOS (NMOS) diode-connected resistors.

In yet other features, a switching gain module communicates with the load module and the bypass module and generates the first voltage value based on an input voltage value. The switching gain module includes first and second switches. First terminals of the first and second switches communicate with the second ends of the first and second resistances and the second ends of the first and second capacitances, respectively. The first and second switches are p-channel metal-oxide semiconductor (PMOS) transistors. First and second differential polarities of the input voltage value are input to control terminals of the first and second switches, respectively. A bias generation module communicates with the programmable gain module and generates a bias current for the level shifter circuit. The bias generation module includes first and second current sources. Second ends of the first and second current sources communicate with the first ends of the first and second resistances, respectively, the first ends of the first and second capacitances, respectively, and the first and second ends of the programmable resistance, respectively.

In still other features of the invention, an output driver module receives the fourth voltage value and generates an output voltage value based on the fourth voltage value. The output driver module includes first and second switches and first and second current sources. Control terminals of the first and second switches communicate with the first ends of the first and second resistances, respectively, the first ends of the first and second capacitances, respectively, and the first and second ends of the programmable resistance, respectively. Second terminals of the first and second switches communicate with first ends of the first and second current sources, respectively. The first and second switches are n-channel metal-oxide semiconductor (NMOS) transistors. First and second differential polarities of the output voltage value are referenced from the second terminals of the first and second switches, respectively.

In yet other features, the load module includes a first resistance. The programmable gain module includes a programmable resistance. The bypass module includes a first capacitance. A first end of the first capacitance communicates with a first end of the first resistance. A second end of the first capacitance communicates with a second end of the first resistance. A first end of the programmable resistance communicates with the first end of the first resistance and the first end of the first capacitance. The first resistance is one of a p-channel metal-oxide semiconductor (PMOS) diode-connected resistor or an n-channel MOS (NMOS) diode-connected resistor.

In still other features of the invention, a switching gain module communicates with the load module and the bypass module and generates the first voltage value based on an input voltage value. The switching gain module includes a first switch. A first terminal of the first switch communicates with the second end of the first resistance and the second end of the first capacitance. The first switch is a p-channel metal-oxide semiconductor (PMOS) transistor. The input voltage value is input to a control terminal of the first switch. A bias generation module communicates with the programmable gain module and generates a bias current for the level shifter circuit. The bias generation module includes a first current source. A second end of the first current source communicates with the first end of the first resistance, the first end of the first capacitance, and the first end of the programmable resistance.

In yet other features, an output driver module receives the fourth voltage value and generates an output voltage value based on the fourth voltage value. The output driver module includes a first switch and a first current source. A control terminal of the first switch communicates with the first end of the first resistance, the first end of the first capacitance, and the first end of the programmable resistance. A second terminal of the first switch communicates with a first end of the first current source. The first switch is an n-channel metal-oxide semiconductor (NMOS) transistor. The output voltage value is referenced from the second terminal of the first switch.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1 is a functional block diagram of an exemplary data storage device according to the prior art;

FIG. 2 is an exemplary functional block diagram of a read data path in a data storage device that includes a level shifter according to the prior art;

DETAILED DESCRIPTION OF THE PREFERRED EMBODIMENTS

Figure 3:
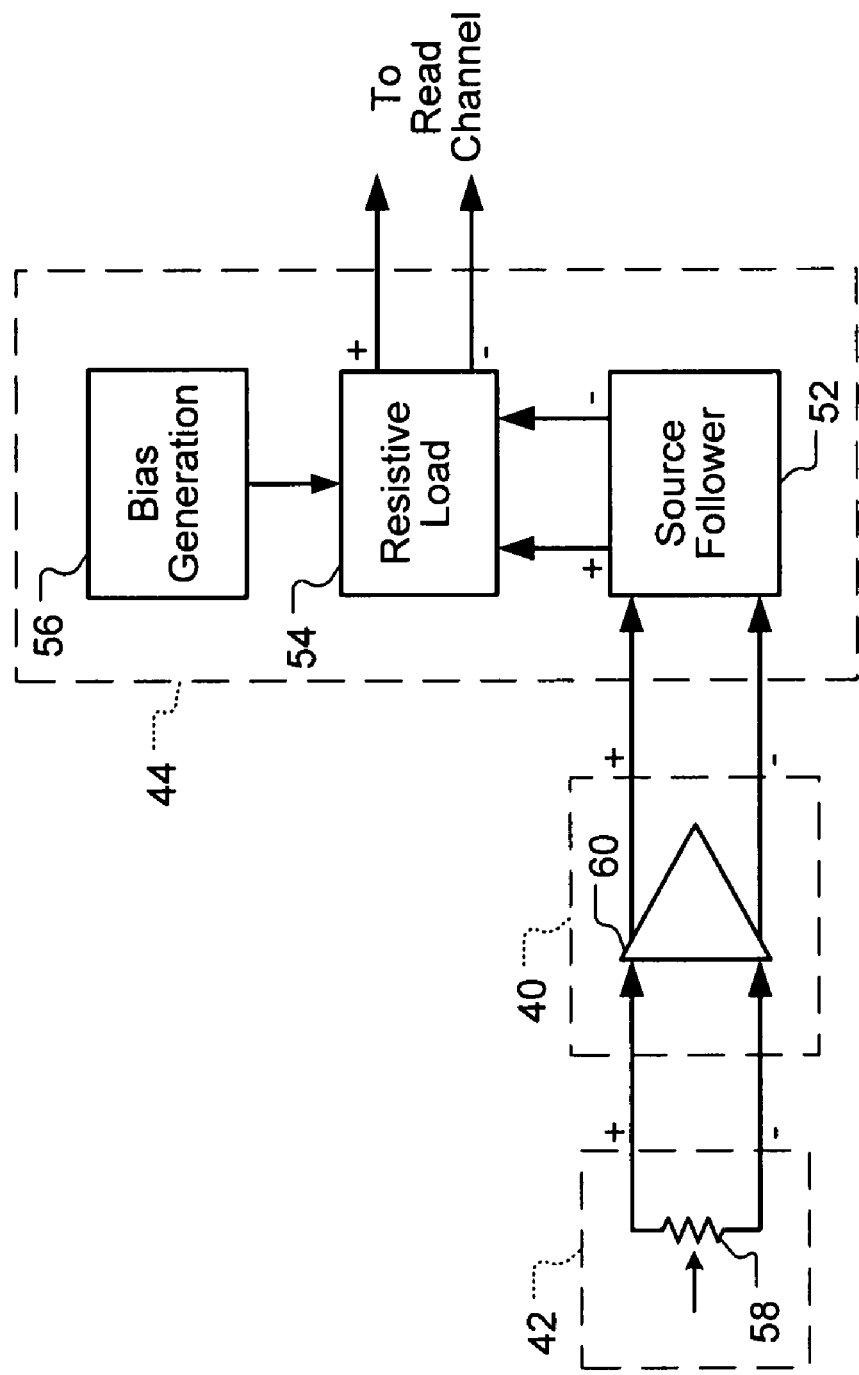
FIG. 3 is a functional block diagram of the read data path in FIG. 2 illustrated in further detail according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

Figure 4:
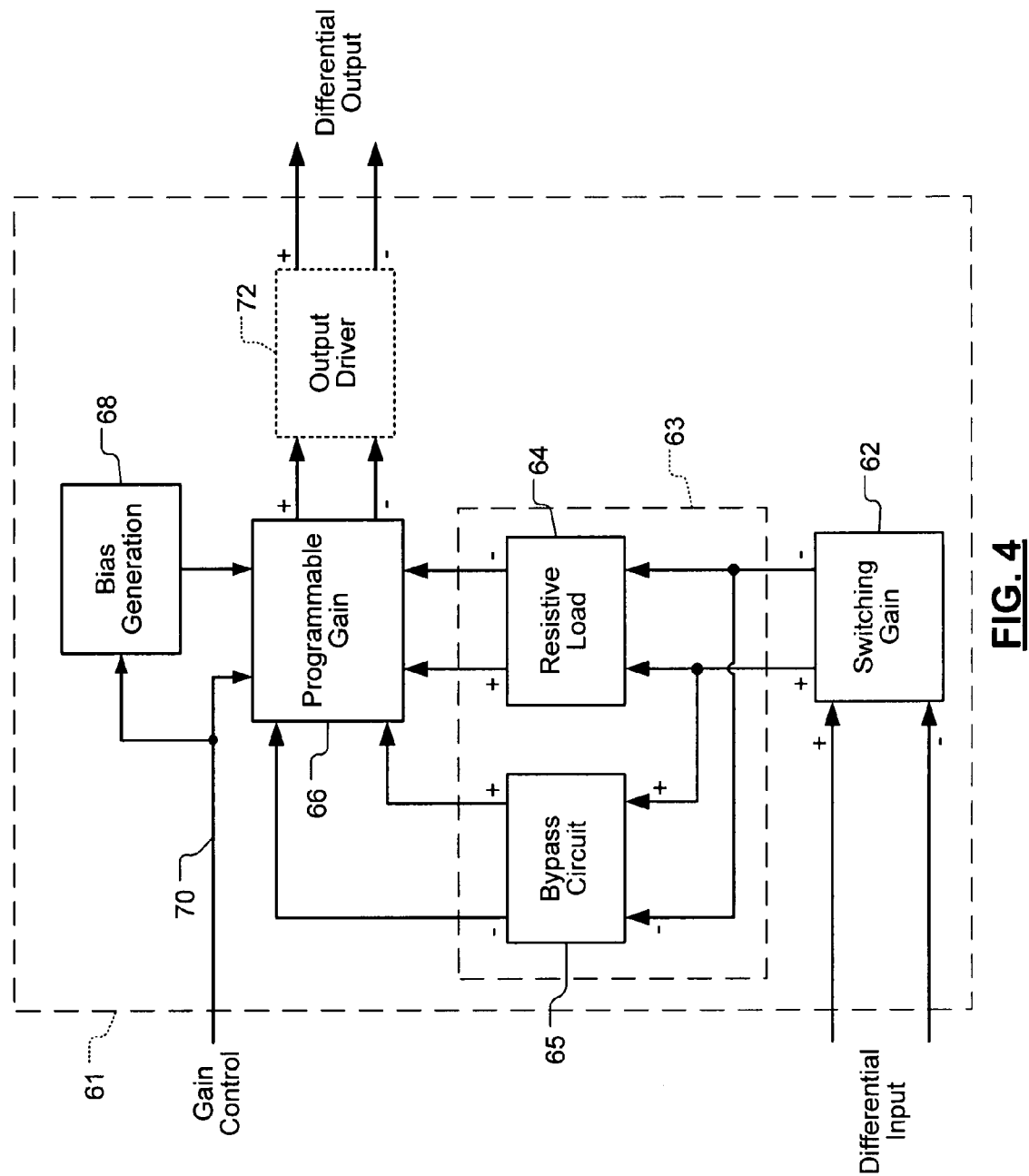
FIG. 4 is a functional block diagram of a level shifter with an adjustable gain in a differential configuration according an exemplary embodiment of the present invention.

Referring now to FIG. 4, an exemplary level shifter circuit 61 in a differential configuration according to the present invention includes a switching gain module 62 that receives a differential input voltage value. The switching gain module 62 generates a first voltage value based on the differential input voltage value. A bias module 63 receives the first voltage value and includes a load module 64 and a bypass module 65. The load module 64 receives the first voltage value and generates a second voltage value based on the first voltage value. A programmable gain module 66 receives the second voltage value and generates a third voltage value. The bypass module 65 communicates with the programmable gain module 66 and also receives the first voltage value.

The bypass module 65 bypasses the load module 64 and transmits the first voltage value to the programmable gain module 66 during high frequency operation. Therefore, the programmable gain module 66 generates the third voltage value based on the second voltage value during normal operation and based on the first voltage value during high frequency operation. A bias generation module 68 communicates with the programmable gain module 66 and generates a bias current for the level shifter circuit 61. The programmable gain module 66 and the bias generation module 68 receive a gain control signal 70. The gain control signal 70 selectively adjusts a resistance of a resistive load in the programmable gain module 66 to adjust a gain of the level shifter circuit 61. The gain control signal 70 also selectively adjusts the value of the bias current that is generated by the bias generation module 68 to adjust the gain of the level shifter circuit 61. While a single gain control signal 70 is illustrated in FIG. 4, the programmable gain module 66 and the bias generation module 68 may solely receive a control signal or both receive independent control signals.

The gain adjustment may be a mechanical adjustment that is made before, during, or after manufacturing. Additionally, the gain adjustment may be made automatically by a controller during normal operation. The level shifter circuit 61 optionally includes an output driver module 72. The output driver module 72 receives the third voltage value from the programmable gain module 66 and generates an output voltage value. The level shifter circuit 61 shifts a range of voltages that occur between the differential output terminals with respect to the differential input terminals. For example, the negative terminal of the differential input voltage may be referenced to ground. In this case, the level shifter circuit 61 shifts the range of voltages that occur on the differential output terminals in either a positive or a negative direction so that the negative output terminal is not referenced to ground.

Figure 5:
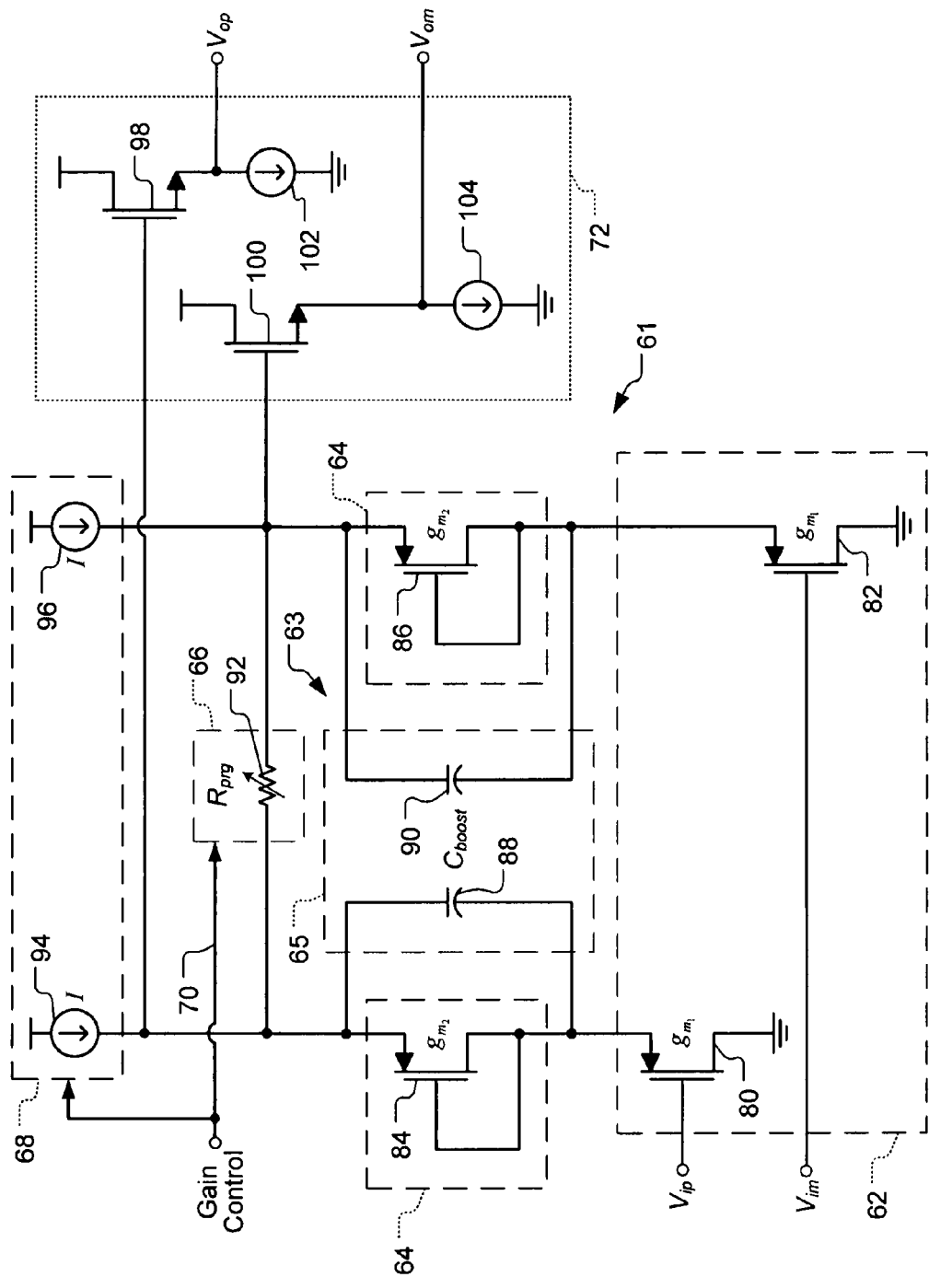
FIG. 5 is a functional block diagram and electrical schematic of the level shifter in FIG. 4 illustrated in further detail.

Referring now to FIG. 5, the exemplary level shifter circuit 61 in a differential configuration is illustrated in further detail. The switching gain module 62 includes first and second transistors 80 and 82, respectively. For example, the first and second transistors 80 and 82, respectively, may be p-channel metal-oxide semiconductor (PMOS) field-effect transistors (FETs) that have gates, sources, and drains, although other transistor types may be used. Drains (or second terminals) of the first and second transistors 80 and 82, respectively, communicate with a ground potential. Gates (or control terminals) of the first and second transistors 80 and 82, respectively, communicate with positive ($V_{ip}$) and negative ($V_{im}$) terminals of the differential input voltage, respectively. The first and second transistors 80 and 82, respectively, both have a transconductance of $g_{m_1}$. Therefore, the first and second transistors 80 and 82, respectively, both have a resistance of $$\frac{1}{g_{m_1}}.$$

The load module 64 includes first and second resistive elements 84 and 86, respectively. For example, in FIG. 5, the first and second resistive elements 84 and 86, respectively, are PMOS diode-connected transistors 84 and 86. However, n-channel MOS (NMOS) diode-connected transistors or conventional resistors may be used. The PMOS diode-connected transistors 84 and 86 include a PMOS transistor with the gate connected to the drain. Drains of the first and second diode-connected transistors 84 and 86, respectively, communicate with sources of the first and second transistors 80 and 82, respectively, in the switching gain module 62. The first and second diode-connected transistors 84 and 86, respectively, both have a transconductance of $g_{m_2}$. Therefore, the first and second diode-connected transistors 84 and 86, respectively, both have a resistance of $$\frac{1}{g_{m_2}}.$$

The bypass module 65 includes first and second capacitors 88 and 90, respectively. A first end of the first capacitor 88 communicates with a source of the first diode-connected transistor 84, and a second end of the first capacitor 88 communicates with the drain of the first diode-connected transistor 84. A first end of the second capacitor 90 communicates with a source of the second diode-connected transistor 86, and a second end of the second capacitor 90 communicates with the drain of the second diode-connected transistor 86. The first and second capacitors 88 and 90, respectively, have a value of $C_{boost}$ and are shorted during high frequency operation. Therefore, both the first and second diode-connected transistors 84 and 86, respectively, are shorted during high frequency operation.

The programmable gain module 66 includes a programmable resistor 92 with a resistance $R_{prg}$. A first end of the programmable resistor 92 communicates with the source of the first diode-connected resistor 84 and the first end of the first capacitor 88. A second end of the programmable resistor 92 communicates with the source of the second diode-connected resistor 86 and the first end of the second capacitor 90. The gain control signal 70 communicates with the programmable gain module 66. The resistance of the programmable resistor 92 may be adjusted to adjust the gain of the level shifter circuit 61, as will be described in more detail below.

The bias generation module 68 includes first and second current sources 94 and 96, respectively. A first end of the first current source 94 communicates with a supply potential, and a second end of the first current source 94 communicates with the source of the first diode-connected resistor 84, the first end of the first capacitor 88, and the first end of the programmable resistor 92. A first end of the second current source 96 communicates with a supply potential, and a second end of the second current source 96 communicates with the source of the second diode-connected resistor 86, the first end of the second capacitor 90, and the second end of the programmable resistor 92. The first and second current sources 94 and 96, respectively, both supply a current I to the level shifter circuit 61. The gain control signal 70 communicates with the bias generation module 68. The value of I may be adjusted to adjust the gain of the level shifter circuit 61, as will be described in more detail below.

The output driver module 72 includes third and fourth transistors 98 and 100, respectively. For example, the third and fourth transistors 98 and 100, respectively, may be NMOS transistors, although other transistors may be used. Drains of the third and fourth transistors 98 and 100, respectively, communicate with a supply potential. A gate of the third transistor 98 communicates with the second end of the first current source 94, the source of the first diode-connected resistor 84, the first end of the first capacitor 88, and the first end of the programmable resistor 92. A gate of the fourth transistor 100 communicates with the second end of the second current source 96, the source of the second diode-connected resistor 86, the first end of the second capacitor 90, and the second end of the programmable resistor 92.

The output driver module 72 also includes third and fourth current sources 102 and 104, respectively. A first end of the third current source 102 communicates with a source of the third transistor 98, and a first end of the fourth current source 104 communicates with a source of the fourth transistor 100. Second ends of the third and fourth current sources 102 and 104, respectively, communicate with a ground potential. Sources of the third and fourth transistors 98 and 100, respectively, communicate with positive ($V_{op}$) and negative ($V_{om}$) terminals of the differential output voltage, respectively.

Figure 6:
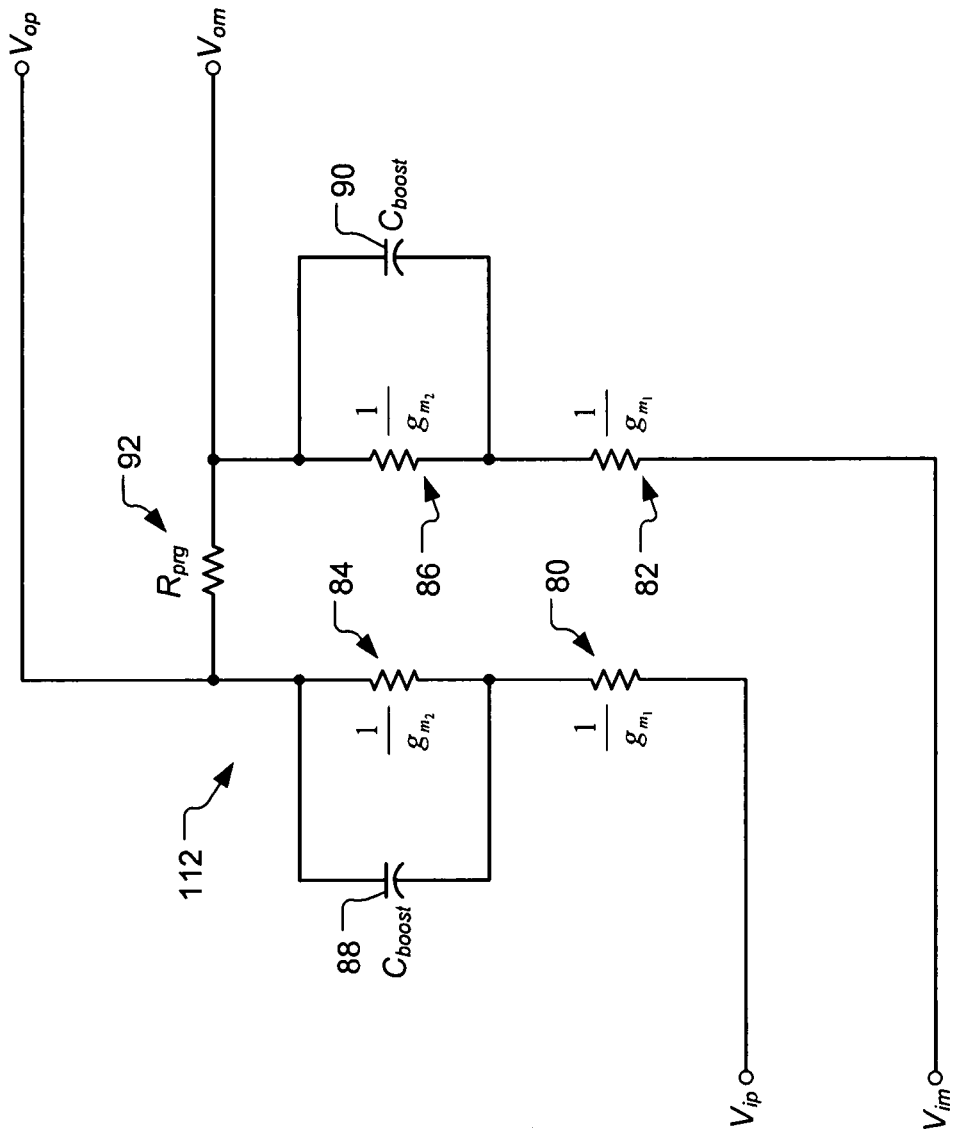
FIG. 6 is an electrical schematic and equivalent circuit diagram of the level shifter in FIG. 5.

Referring now to FIG. 6, an equivalent circuit 112 to the level shifter circuit 61 in a differential configuration is shown for purposes of determining the gain of the level shifter circuit 61. The output voltage of the level shifter circuit 61 is determined according to a voltage divider operation. During normal frequency operation, the midband gain of the level shifter circuit 61 is $$\frac{R_{prg}}{\frac{2}{g_{m_1}} + \frac{2}{g_{m_2}} + R_{prg}}.$$

During high frequency operation, the first and second capacitors 88 and 90, respectively, short and effectively remove the first and second diode-connected resistors 84 and 86, respectively, from the equivalent circuit 112. Therefore, during high frequency operation, the midband gain of the level shifter circuit 61 is $$\frac{R_{prg}}{\frac{2}{g_{m_1}} + R_{prg}},$$

which effectuates an increase in the gain of the level shifter circuit 61.

Additionally, the transconductance $g_{m_1}$ of the first and second transistors 80 and 82, respectively, is equivalent to the square root of the current $\sqrt{I}$ that is generated by the first and second current sources 94 and 96, respectively. Since $g_{m_1}$ remains in the midband gain function during high frequency operation, the value of I and/or the value of $R_{prg}$ may be adjusted to adjust the gain of the level shifter circuit 61. This allows for an additional degree of freedom in the design of the level shifter circuit 61 as well as control of the circuit 61 during operation.

Figure 7:
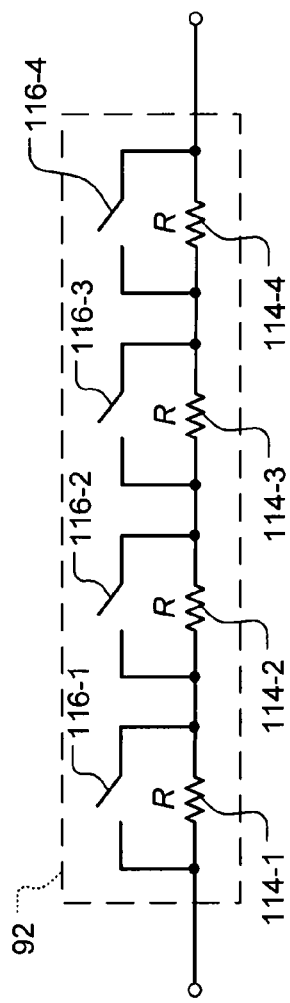
FIG. 7 is an electrical schematic of an exemplary programmable resistor.

Referring now to FIG. 7, an exemplary programmable resistor 92 includes resistors 114-1, 114-2, 114-3, and 114-4 that are connected in series. Switches 116-1, 116-2, 116-3, and 116-4 are connected in parallel with each of the resistors 114-1, 114-2, 114-3, and 114-4. A current state of the switches 116-1, 116-2, 116-3, and 116-4 (open or closed) is programmable and determines the overall resistance of the programmable resistor 92. For example, if each of the switches 116-1, 116-2, 116-3, and 116-4 is open and the resistors 114-1, 114-2, 114-3, and 114-4 all have a resistance R, the total resistance of the programmable resistor 92 is equal to 4×R=4R.

Figure 8:
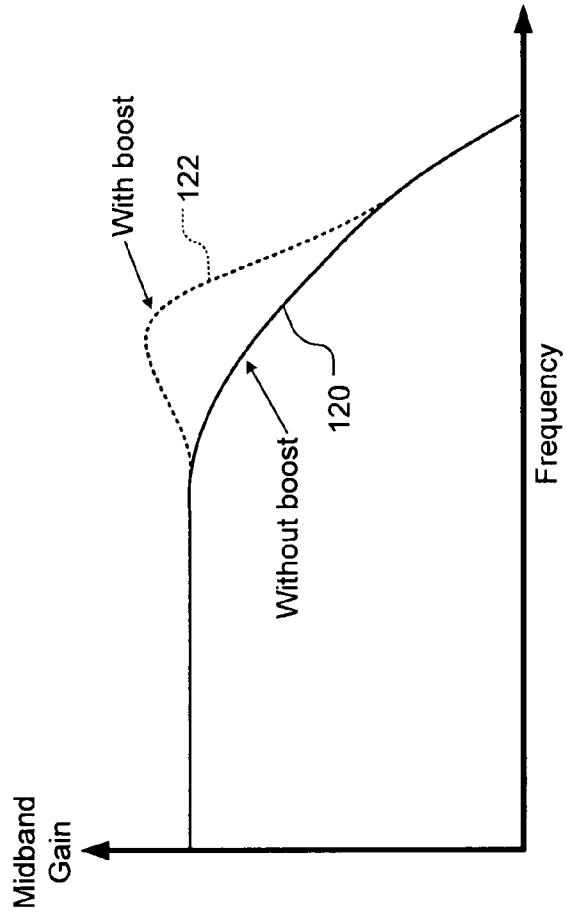
FIG. 8 is a plot illustrating the midband gain of the level shifter as a function of frequency.

Referring now to FIG. 8, a plot of the midband gain illustrates the increase in gain that occurs during high frequency operation. A first function 120 illustrates the path of the curve when the first and second capacitors 88 and 90, respectively, are not utilized to bypass the first and second diode-connected resistors 84 and 86, respectively, during high frequency operation. A second function 122 (indicated by a dotted-line) illustrates a spike in the gain during high frequency operation when the first and second capacitors 88 and 90, respectively, are used.

Figure 9:
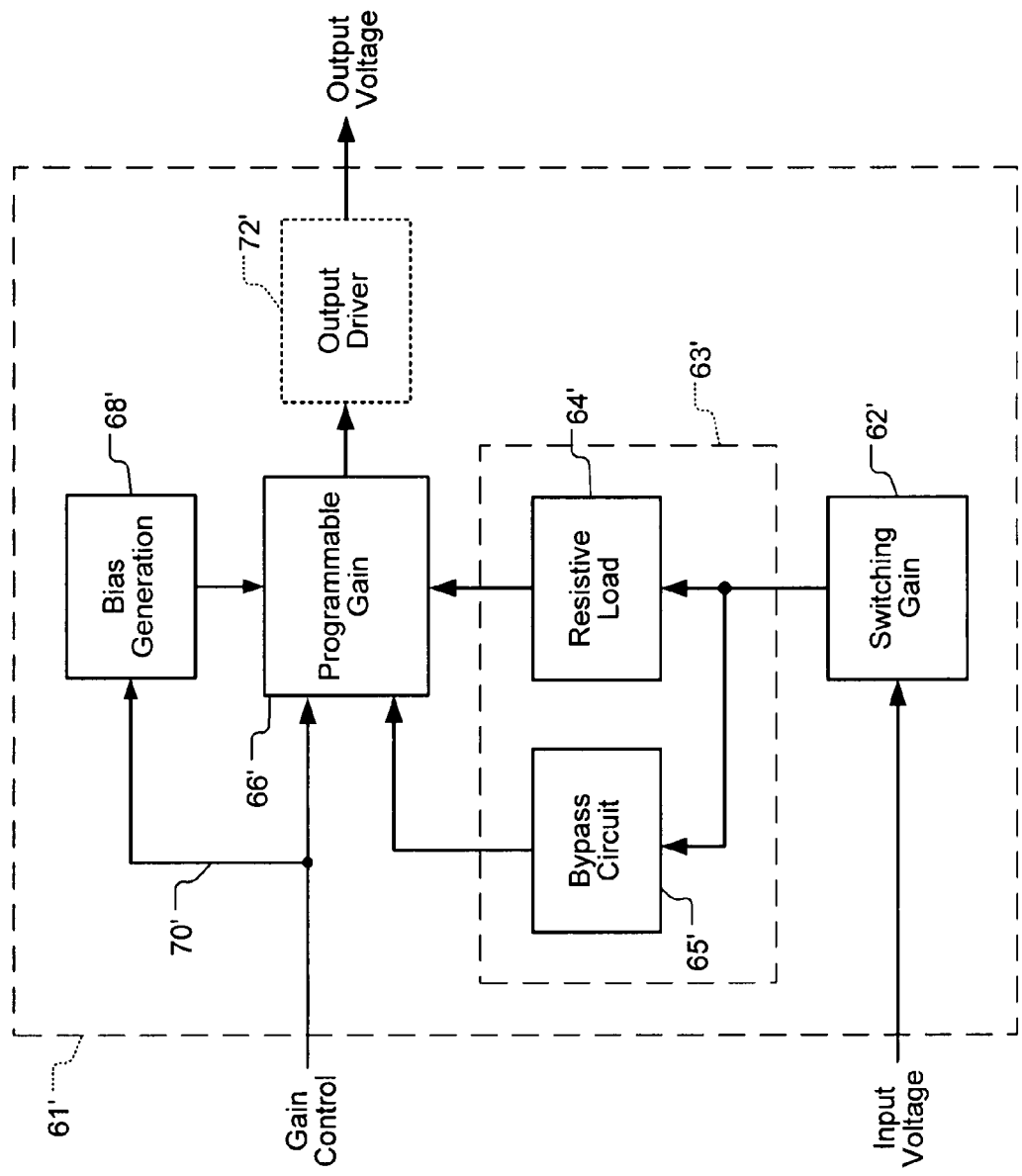
FIG. 9 is a functional block diagram of a level shifter with an adjustable gain in a single-ended configuration according to another exemplary embodiment of the present invention.
Figure 10:
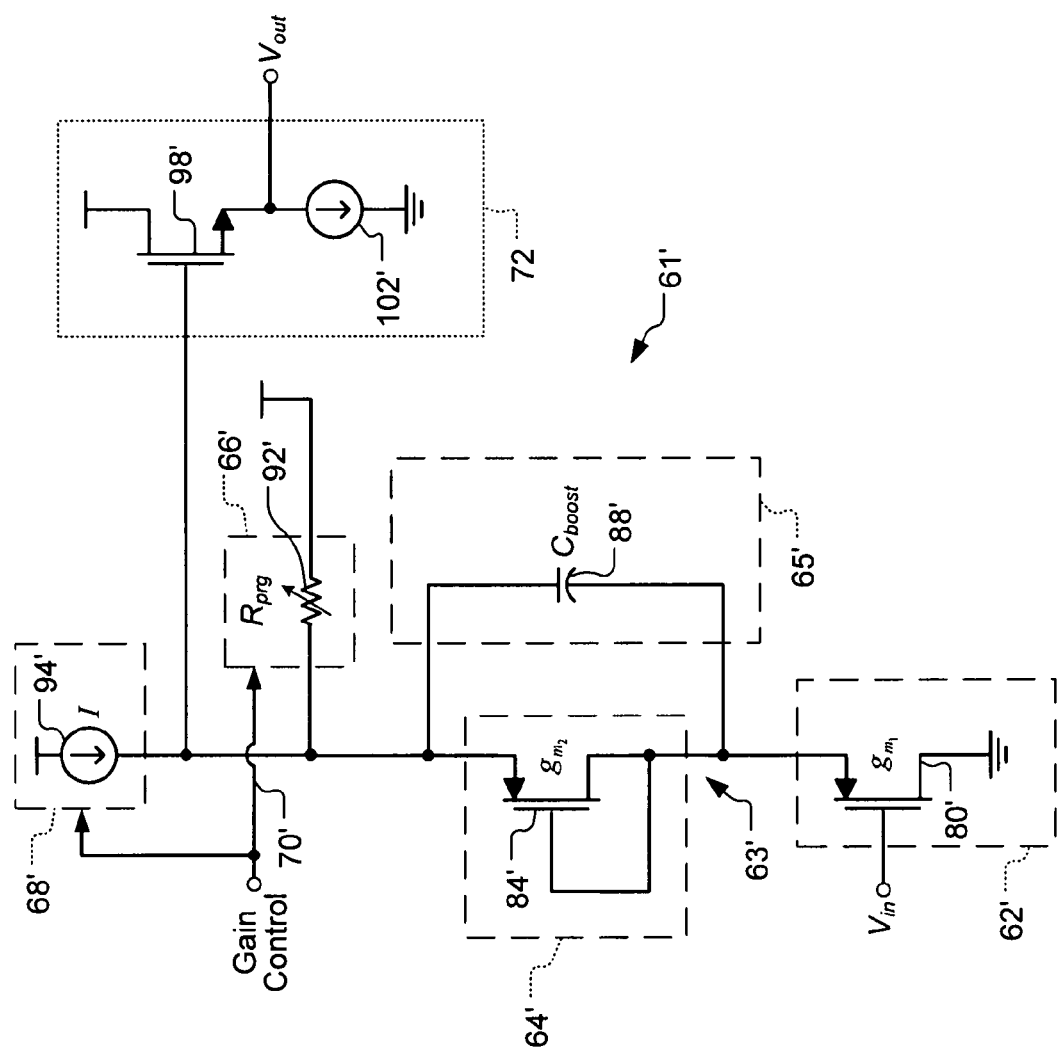
FIG. 10 is a functional block diagram and electrical schematic of the level shifter in FIG. 9 illustrated in further detail.

Referring now to FIG. 9, an exemplary level shifter circuit 61' in a single-ended configuration according to the present invention is shown. The single-ended configuration of the level shifter circuit 61' functions similarly to the differential configuration of the level shifter circuit 61 illustrated in FIGS. 4 and 5. Additionally, elements shown in FIGS. 9 and 10 are labeled similarly to elements shown in FIGS. 4 and 5. For example, in FIG. 4, the level shifter circuit is identified by 61, and in FIG. 9 the level shifter circuit is identified by 61'.

The level shifter circuit 61' includes a switching gain module 62' that receives a single-ended input voltage value. The switching gain module 62' generates a first voltage value based on the single-ended input voltage value. A bias module 63' receives the first voltage value and includes a load module 64' and a bypass module 65'. The load module 64' receives the first voltage value and generates a second voltage value based on the first voltage value. A programmable gain module 66' receives the second voltage value and generates a third voltage value. The bypass module 65' communicates with the programmable gain module 66' and also receives the first voltage value.

The bypass module 65' transmits the first voltage value to the programmable gain module 66'. The programmable gain module 66' generates the third voltage value based on the second voltage value during normal operation and based on the first voltage value during high frequency operation. A bias generation module 68' communicates with the programmable gain module 66' and generates a bias current for the level shifter circuit 61'. The programmable gain module 66' and the bias generation module 68' receive a gain control signal 70'. The gain control signal 70' selectively adjusts a resistance of a resistive load in the programmable gain module 66' to adjust a gain of the level shifter circuit 61'. The gain control signal 70' also selectively adjusts the value of the bias current that is generated by the bias generation module 68' to adjust the gain of the level shifter circuit 61'. The level shifter circuit 61' optionally includes an output driver module 72'. The output driver module 72' receives the third voltage value from the programmable gain module 66' and generates an output voltage value.

Referring now to FIG. 10, the exemplary level shifter circuit 61' in a single-ended configuration is illustrated in further detail. The switching gain module 62' includes a first transistor 80'. A drain of the first transistor 80' communicates with a ground potential. A gate of the first transistor 80' communicates with a single-ended input voltage terminal ($V_{in}$). The first transistor 80' has a transconductance of $g_{m_1}$ and a resistance of $$\frac{1}{g_{m_1}}.$$

The load module 64' includes a first diode-connected resistor 84'. A drain of the first diode-connected resistor 84' communicates with a source of the first transistor 80' in the switching gain module 62'. The first diode-connected resistor 84' has a transconductance of $g_{m_2}$ and a resistance of $$\frac{1}{g_{m_2}}.$$

The bypass module 65' includes a first capacitor 88'. A first end of the first capacitor 88' communicates with a source of the first diode-connected resistor 84', and a second end of the first capacitor 88' communicates with the drain of the first diode-connected resistor 84'. The first capacitor 88' has a value of $C_{boost}$ and is shorted during high frequency operation. The programmable gain module 66' includes a programmable resistor 92' with a resistance $R_{prg}$. A first end of the programmable resistor 92' communicates with the source of the first diode-connected resistor 84' and the first end of the first capacitor 88'. A second end of the programmable resistor 92' communicates with a supply potential. Therefore, a DC current flows through the programmable resistor 92' when the level shifter circuit 61' is in the single-ended configuration. The gain control signal 70' communicates with the programmable gain module 66'. The resistance of the programmable resistor 92' may be adjusted to adjust the gain of the level shifter circuit 61'.

The bias generation module 68' includes a first current source 94'. A first end of the first current source 94' communicates with a supply potential, and a second end of the first current source 94' communicates with the source of the first diode-connected resistor 84', the first end of the first capacitor 88', and the first end of the programmable resistor 92'. The first current source 94' supplies a current I to the level shifter circuit 61'. The gain control signal 70' communicates with the bias generation module 68'. The value of I may be adjusted to adjust the gain of the level shifter circuit 61'.

The output driver module 72' includes a second transistor 98'. A drain of the second transistor 98' communicates with a supply potential. A gate of the second transistor 98' communicates with the second end of the first current source 94', the source of the first diode-connected resistor 84', the first end of the first capacitor 88', and the first end of the programmable resistor 92'. The output driver module 72' also includes a second current source 102'. A first end of the second current source 102' communicates with a source of the second transistor 98', and a second end of the second current source 102' communicates with a ground potential. The source of the second transistor 98' communicates with a single-ended output voltage terminal ($V_{out}$).

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. A level shifter circuit, comprising:
    a bias module that receives a first signal and that selectively outputs a selected one of a second signal and a third signal based on an operating frequency of said level shifter circuit;
    a programmable gain module that receives a gain control signal, and that generates a fourth signal based on said gain control signal and said selected one of said second signal and said third signal; and
    a bias generation module that communicates with said programmable gain module, that receives said gain control signal, and that generates a bias for said level shifter circuit based on said gain control signal.

2. The level shifter circuit of claim 1 wherein said bias module includes:
    a load module that receives said first signal and that generates said second signal; and
    a bypass module that receives said first signal and that generates said third signal.

3. The level shifter circuit of claim 1 wherein said first signal and said third signal are substantially equal.

4. The level shifter circuit of claim 1 wherein a gain of said programmable gain module determines a gain of said level shifter circuit.

5. The level shifter circuit of claim 1 further comprising a switching gain module that communicates with said bias module and that generates said first signal based on an input signal.

6. The level shifter circuit of claim 1 wherein said bias determines a gain of said level shifter circuit.

7. The level shifter circuit of claim 1 further comprising an output driver module that receives said fourth signal and that generates an output signal based on said fourth signal.

8. The level shifter circuit of claim 2 wherein said load module includes first and second resistances, said programmable gain module includes a programmable resistance, said bypass module includes first and second capacitances, first ends of said first and second capacitances communicate with first ends of said first and second resistances, respectively, second ends of said first and second capacitances communicate with second ends of said first and second resistances, respectively, and first and second ends of said programmable resistance communicate with said first ends of said first and second resistances, respectively, and said first ends of said first and second capacitances.

9. The level shifter circuit of claim 8 further comprising a switching gain module that communicates with said load module and said bypass module and that generates said first signal based on an input signal and wherein said switching gain module includes first and second switches, first terminals of said first and second switches communicate with said second ends of said first and second resistances and said second ends of said first and second capacitances, respectively.

10. The level shifter circuit of claim 8 wherein said bias generation module includes first and second current sources and second ends of said first and second current sources communicate with said first ends of said first and second resistances, respectively, said first ends of said first and second capacitances, respectively, and said first and second ends of said programmable resistance, respectively.

11. The level shifter circuit of claim 8 further comprising an output driver module that receives said fourth signal and that generates an output signal based on said fourth signal and wherein said output driver module includes first and second switches and first and second current sources, control terminals of said first and second switches communicate with said first ends of said first and second resistances, respectively, said first ends of said first and second capacitances, respectively, and said first and second ends of said programmable resistance, respectively, and second terminals of said first and second switches communicate with first ends of said first and second current sources, respectively.

12. The level shifter circuit of claim 2 wherein said load module includes a first resistance, said programmable gain module includes a programmable resistance, said bypass module includes a first capacitance, a first end of said first capacitance communicates with a first end of said first resistance, a second end of said first capacitance communicates with a second end of said first resistance, and a first end of said programmable resistance communicates with said first end of said first resistance and said first end of said first capacitance.

13. The level shifter circuit of claim 12 further comprising a switching gain module that communicates with said load module and said bypass module and that generates said first signal based on an input signal and wherein said switching gain module includes a first switch, and a first terminal of said first switch communicates with said second end of said first resistance and said second end of said first capacitance.

14. The level shifter circuit of claim 12 wherein said bias generation module includes a first current source, and a second end of said first current source communicates with said first end of said first resistance, said first end of said first capacitance, and said first end of said programmable resistance.

15. The level shifter circuit of claim 12 further comprising an output driver module that receives said fourth signal and that generates an output signal based on said fourth signal and wherein said output driver module includes a first switch and a first current source, a control terminal of said first switch communicates with said first end of said first resistance, said first end of said first capacitance, and said first end of said programmable resistance, and a second terminal of said first switch communicates with a first end of said first current source.

16. A method comprising:
receiving a first signal at a bias module;
selectively outputting a selected one of a second signal and a third signal from the bias module based on an operating frequency of a level shifter circuit;
generating a fourth signal using a programmable gain module based on a gain control signal and said selected one of said second signal and said third signal;
receiving said gain control signal at a bias generation module; and
generating a bias for said level shifter circuit based on said gain control signal using the bias generation module.

17. The method of claim 16 wherein said bias module includes:
a load module that receives said first signal and that generates said second signal; and
a bypass module that receives said first signal and that generates said third signal.

18. The method of claim 16 wherein said first signal and said third signal are substantially equal.

19. The method of claim 16 further comprising determining a gain of said level shifter circuit based on a gain of said programmable gain module.

20. The method of claim 16 further comprising providing a switching gain module that communicates with said bias module and that generates said first signal based on an input signal.

21. The method of claim 16 further comprising determining a gain of said level shifter circuit based on said bias.

22. The method of claim 16 further comprising providing an output driver module that receives said fourth signal and that generates an output signal based on said fourth signal.

23. The method of claim 17 wherein said load module includes first and second resistances, said programmable gain module includes a programmable resistance, said bypass module includes first and second capacitances, first ends of said first and second capacitances communicate with first ends of said first and second resistances, respectively, second ends of said first and second capacitances communicate with second ends of said first and second resistances, respectively, and first and second ends of said programmable resistance communicate with said first ends of said first and second resistances, respectively, and said first ends of said first and second capacitances.

24. The method of claim 23 further comprising providing a switching gain module that communicates with said load module and said bypass module and that generates said first signal based on an input signal and wherein said switching gain module includes first and second switches, first terminals of said first and second switches communicate with said second ends of said first and second resistances and said second ends of said first and second capacitances, respectively.

25. The method of claim 23 wherein said bias generation module includes first and second current sources and second ends of said first and second current sources communicate with said first ends of said first and second resistances, respectively, said first ends of said first and second capacitances, respectively, and said first and second ends of said programmable resistance, respectively.

26. The method of claim 23 further comprising providing an output driver module that receives said fourth signal and that generates an output signal based on said fourth signal and wherein said output driver module includes first and second switches and first and second current sources, control terminals of said first and second switches communicate with said first ends of said first and second resistances, respectively, said first ends of said first and second capacitances, respectively, and said first and second ends of said programmable resistance, respectively, and second terminals of said first and second switches communicate with first ends of said first and second current sources, respectively.

27. The method of claim 17 wherein said load module includes a first resistance, said programmable gain module includes a programmable resistance, said bypass module includes a first capacitance, a first end of said first capacitance communicates with a first end of said first resistance, a second end of said first capacitance communicates with a second end of said first resistance, and a first end of said programmable resistance communicates with said first end of said first resistance and said first end of said first capacitance.

28. The method of claim 27 further comprising providing a switching gain module that communicates with said load module and said bypass module and that generates said first signal based on an input signal and wherein said switching gain module includes a first switch, and a first terminal of said first switch communicates with said second end of said first resistance and said second end of said first capacitance.

29. The method of claim 27 wherein said bias generation module includes a first current source, and a second end of said first current source communicates with said first end of said first resistance, said first end of said first capacitance, and said first end of said programmable resistance.

30. The method of claim 27 further comprising providing an output driver module that receives said fourth signal and that generates an output signal based on said fourth signal and wherein said output driver module includes a first switch and a first current source, a control terminal of said first switch communicates with said first end of said first resistance, said first end of said first capacitance, and said first end of said programmable resistance, and a second terminal of said first switch communicates with a first end of said first current source.

* * * * *

UNITED STATES PATENT AND TRADEMARK OFFICE
CERTIFICATE OF CORRECTION

PATENT NO. : 7,417,484 B1
APPLICATION NO. : 11/710362
DATED : August 26, 2008
INVENTOR(S) : Thart Fah Voo It is certified that error appears in the above-identified patent and that said Letters Patent is hereby corrected as shown below:

Column 1, Line 46　　Delete "spindleNCM" and insert -- spindle/VCM --
Column 1, Line 47　　Delete "spindleNCM" and insert -- spindle/VCM --
Column 4, Line 42　　Insert -- to -- after "according"

Signed and Sealed this

Twenty-first Day of October, 2008

JON W. DUDAS
*Director of the United States Patent and Trademark Office*